(12) United States Patent
Otterstedt et al.

(10) Patent No.: US 10,157,095 B2
(45) Date of Patent: Dec. 18, 2018

(54) METHOD OF USING A MEMORY DEVICE, MEMORY DEVICE AND MEMORY DEVICE ASSEMBLY

(71) Applicant: Infineon Technologies AG, Neubiberg (DE)

(72) Inventors: Jan Otterstedt, Unterhaching (DE); Michael Gössel, Mahlow (DE); Thomas Rabenalt, Unterhaching (DE); Thomas Kern, Aschheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/490,950

(22) Filed: Apr. 19, 2017

(65) Prior Publication Data

US 2017/0308431 A1    Oct. 26, 2017

(30) Foreign Application Priority Data

Apr. 20, 2016 (DE) .................. 10 2016 107 285

(51) Int. Cl.
*H03M 13/00* (2006.01)
*G06F 11/10* (2006.01)
(Continued)

(52) U.S. Cl.
CPC ........ *G06F 11/1044* (2013.01); *G06F 3/0604* (2013.01); *G06F 3/0659* (2013.01); *G06F 3/0673* (2013.01); *H03M 13/2903* (2013.01); *H03M 13/2906* (2013.01); *H03M 13/2909* (2013.01); *H03M 13/1102* (2013.01); *H03M 13/1108* (2013.01); *H03M 13/13* (2013.01);
(Continued)

(58) Field of Classification Search
CPC .. G06F 11/1044; G06F 3/0604; G06F 3/0659; G06F 3/0613; H03M 13/13
See application file for complete search history.

(56) References Cited

U.S. PATENT DOCUMENTS 7,493,457 B2 * 2/2009 Murin ................ G11C 11/5628
                                                       365/185.01
7,827,472 B2 * 11/2010 Crozier ............. H03M 13/2771
                                                       714/701

(Continued)

*Primary Examiner* — Esaw T Abraham
(74) *Attorney, Agent, or Firm* — Viering, Jentschura & Partner MBB

(57) ABSTRACT

In various embodiments, a method of using a memory device is provided. The method may include storing data units, check units of a first code and check units of a second code in memory cells of the memory device, wherein the data units and the check units of the first code form code words of the first code, and wherein the data units and the check units of the second code form code words of the second code, applying the second code for error correction in at least a portion of the data units and/or in at least a portion of the check units of the first code, after the correcting the errors, retaining at least a retaining portion of the data units and of the check units of the first code and deleting at least a deleting portion of the check units of the second code, thereby freeing the memory cells that are occupied by the deleting portion of the check units of the second code, and during a subsequent using of the memory device, storing data in at least a reuse portion of the freed-up memory cells.

21 Claims, 12 Drawing Sheets

(51) Int. Cl.
  *G06F 3/06* (2006.01)
  *H03M 13/29* (2006.01)
  H03M 13/13 (2006.01)
  H03M 13/11 (2006.01)
  H03M 13/15 (2006.01)
  H03M 13/23 (2006.01)

(52) U.S. Cl.
  CPC ........ *H03M 13/136* (2013.01); *H03M 13/152* (2013.01); *H03M 13/1515* (2013.01); *H03M 13/23* (2013.01); *H03M 13/2957* (2013.01)

(56) References Cited

U.S. PATENT DOCUMENTS

| | | | |
|---|---|---|---|
| 7,844,877 B2 * | 11/2010 | Litsyn | G06F 11/1068 |
| | | | 714/752 |
| 8,495,465 B1 | 7/2013 | Anholt et al. | |
| 8,650,458 B2 * | 2/2014 | Kim | G06F 11/1068 |
| | | | 714/758 |
| 8,886,055 B1 * | 11/2014 | Morero | H04L 1/0041 |
| | | | 398/192 |
| 8,938,656 B2 * | 1/2015 | Liu | G06F 11/1012 |
| | | | 714/763 |
| 9,083,382 B2 * | 7/2015 | Nemazie | G11C 29/808 |
| 9,124,300 B2 * | 9/2015 | Sharon | G06F 11/1012 |
| 9,348,695 B2 * | 5/2016 | Sharon | G11C 29/52 |
| 2008/0016428 A1 | 1/2008 | Lee et al. | |
| 2012/0030535 A1 * | 2/2012 | Betts | H03M 13/2707 |
| | | | 714/751 |
| 2013/0246878 A1 * | 9/2013 | Pancholi | H04N 19/13 |
| | | | 714/752 |

* cited by examiner

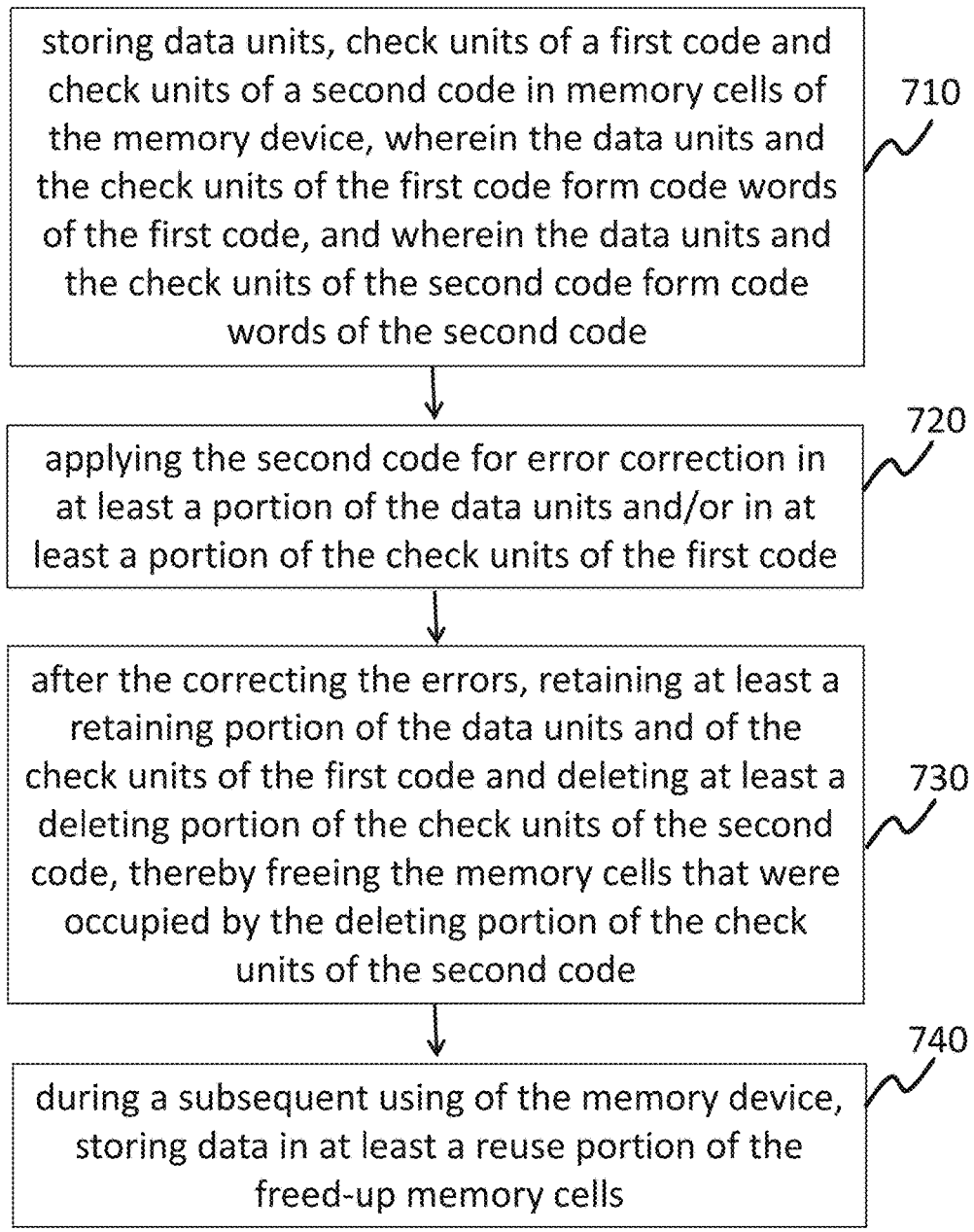

METHOD OF USING A MEMORY DEVICE, MEMORY DEVICE AND MEMORY DEVICE ASSEMBLY

CROSS-REFERENCE TO RELATED APPLICATION

This application claims priority to German Patent Application Serial No. 10 2016 107 285.0, which was filed Apr. 20, 2016, and is incorporated herein by reference in its entirety.

TECHNICAL FIELD

Various embodiments relate generally to a method of correcting errors in a memory device, to a memory device, and to a memory device assembly.

BACKGROUND

Memory devices, e.g. non-volatile memory devices (e.g. RRAM memory devices including RRAM memory cells, also referred to as RRAM cells) may typically not be very stable when high temperature stress is applied. This means that a probability of an RRAM memory cell losing its information may rise drastically with the temperature. In typical consumer and industrial applications, during a lifetime of a memory device or of a chip that may include a memory device, a maximum temperature may be limited to values that are acceptable for RRAM. However, a packaged chip typically may have to be soldered when a board is assembled. During soldering, typically temperatures of 260° C. may be used for up to some minutes.

This temperature applied during soldering may cause stress in the memory device that is so high that an unacceptable probability for RRAM data loss may result.

SUMMARY

In various embodiments, a method of using a memory device is provided. The method may include storing data units, check units of a first code and check units of a second code in memory cells of the memory device. The data units and the check units of the first code form code words of the first code. The data units and the check units of the second code form code words of the second code. The method may further include applying the second code for error correction in at least a portion of the data units and/or in at least a portion of the check units of the first code, after the correcting the errors, retaining at least a retaining portion of the data units and of the check units of the first code and deleting at least a deleting portion of the check units of the second code, thereby freeing the memory cells that are occupied by the deleting portion of the check units of the second code, and during a subsequent using of the memory device, storing data in at least a reuse portion of the freed-up memory cells.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3A to 3F show schematic views of a memory device in accordance with various embodiments during different stages of its use;

FIG. 7 shows a process flow of a method of using a memory device in accordance with various embodiments.

DESCRIPTION

Figure 1:
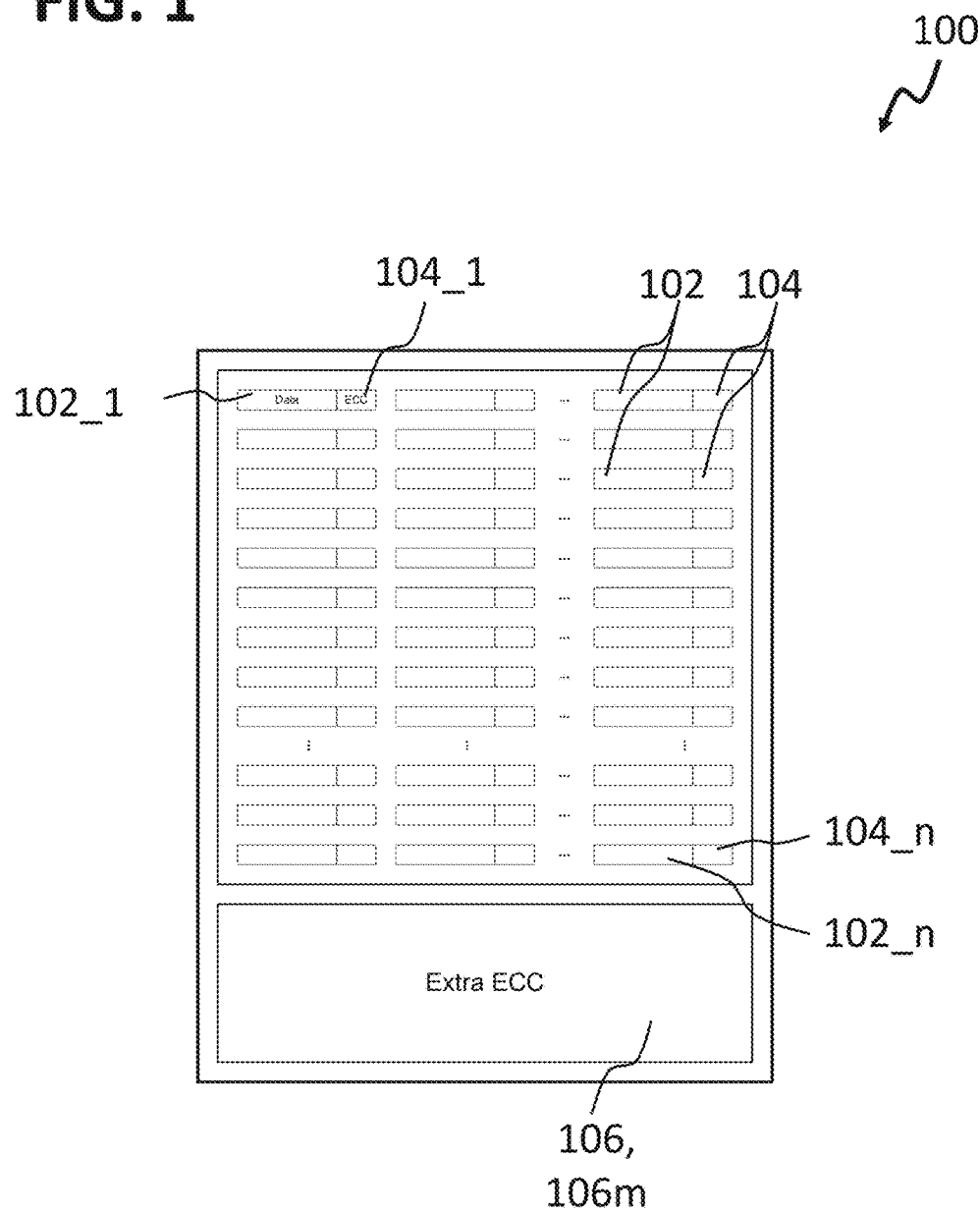
FIG. 1 shows a schematic view of a memory device in accordance with various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

In various embodiments, a method of using a memory device may be provided. When using the memory device, data units, e.g. bits, bytes, multi-valued values or sub-bit values, may be stored in the memory device (also referred to as written to the memory device) and/or read from the memory device. In various embodiments, the memory device may store one bit per memory cell, multiple bits or a value of a range of multiple values, or, e.g. for improving a robustness of the device, a bit may be stored in multiple memory cells, e.g. in two cells, such that in each memory cell only a fraction of a bit may be stored, e.g. 0.5 bits/cell. In the memory cells of the addressable memory device, the data units and check units, e.g. data bits and check bits, may be stored.

A data hazardous process may be understood as a process that has a potential of causing at least a portion of data stored in a memory device to take on erroneous values, while leaving the memory device physically intact otherwise or at least in a tolerable state for the application.

Examples of such a data hazardous process may include heating, for example but not limited to heating during soldering, other temporary temperature stress, temporary stress by radiation, temporary mechanical stress (this may particularly apply to, without being limited thereto, micromechanical and/or electro-mechanical non-volatile memories), mechanical stress during packaging, and any other types of processes or situations that may be data hazardous.

Data loss caused by stressing, e.g. by soldering, of a memory device, e.g. a non-volatile memory device, e.g. an RRM, may in many cases be unacceptable, because a chip may already have stored some memory content even before the chip is soldered to the board, and the memory device may be required to reproduce the stored data correctly. The data may for example include calibration data determined during chip testing, or a full application software that was preloaded during production testing. In any case, the data should not be lost.

In various embodiments, data protection of a memory device, e.g. a non-volatile memory device, e.g. an RRAM (Resistive Random Access Memory), may be provided during a subjecting the memory device to a data-hazardous situation, for example during soldering, by using an additional error correcting code (ECC), also referred to as extra error correcting code (extra ECC). The terms "extra" or "additional" are used to distinguish the extra ECC from typically already existing ECC that may be employed during a normal use of the memory device, e.g. the RRAM. Typically, data stored in the memory device (e.g. the RRAM) may already be extended by some ECC (error correcting code) for protecting the data against data loss during a normal ("every day") operation of the memory device (which may for example be a chip or part of a chip).

In various embodiments, a method of using a memory device, a memory device, (e.g. an RRAM) and a memory device assembly (for example a memory device, e.g. an RRAM, embedded e.g. in a microcontroller chip) may be provided to solve the issue of data loss caused by high temperatures applied to chips during soldering.

In various embodiments, a method of using a memory device, a memory device, (e.g. a non-volatile memory device) and a memory device assembly (for example a memory device, e.g. a non-volatile memory device, embedded e.g. in a microcontroller chip) may be provided that may be configured to provide data protection when it is known or anticipated that an extraordinary stress will be applied to the chip that may endanger data retention.

In various embodiments, additional error correcting capabilities (which may be used as a synonym for error correcting code(s)) may be provided, in order to handle memory device (e.g. RRAM) data retention issues that may be caused by an especially high stress during soldering, e.g. high temperature and/or mechanical stress caused by a mismatch in coefficients of thermal expansion (CTE). This may require an allocation of dedicated extra memory (e.g. RRAM) cells for storing additional ECC data.

In various embodiments, after the stressing, e.g. the soldering, a repair software may be executed, or a dedicated HW may be started. The software or hardware may use the extra ECC capabilities to repair any damage caused by the soldering stress, i.e. to reprogram memory (e.g. RRAM) cells that may have lost their data content, thereby reconstructing a correct data content using the additional error correcting capabilities.

In various embodiments, after a completion of a repair process, e.g. after the reconstructing the correct data content, at least a portion (also referred to as deleting portion) of the extra memory (e.g. RRAM) cells that up to this point in time were used to store the extra ECC data may be de-allocated (i.e. freed), and the memory (e.g. RRAM) cells may be made available for normal use. Thereby, the usable memory (e.g. RRAM) capacity for applications may be increased.

In various embodiments, at least a portion (also referred to as reuse portion) of the freed-up memory cells may be used for storing data. The reuse portion may change over time. It may for example grow to include more of the freed-up memory cells, shrink to include fewer, or be altered to include different memory cells of the freed-up memory cells. In various embodiments, all of the freed-up memory cells may be reused for storing data.

In various embodiments, the re-usability, e.g. for an intended normal use such as data storage, of the extra memory used for storing the extra ECC may allow to use an extra ECC requiring a large storage volume, without thereby decreasing the capacity of the memory that may be available for normal use. The large storage volume available for the extra ECC, may allow to use an extra ECC (e.g., second code) with a large error correcting capability.

Figure 2:
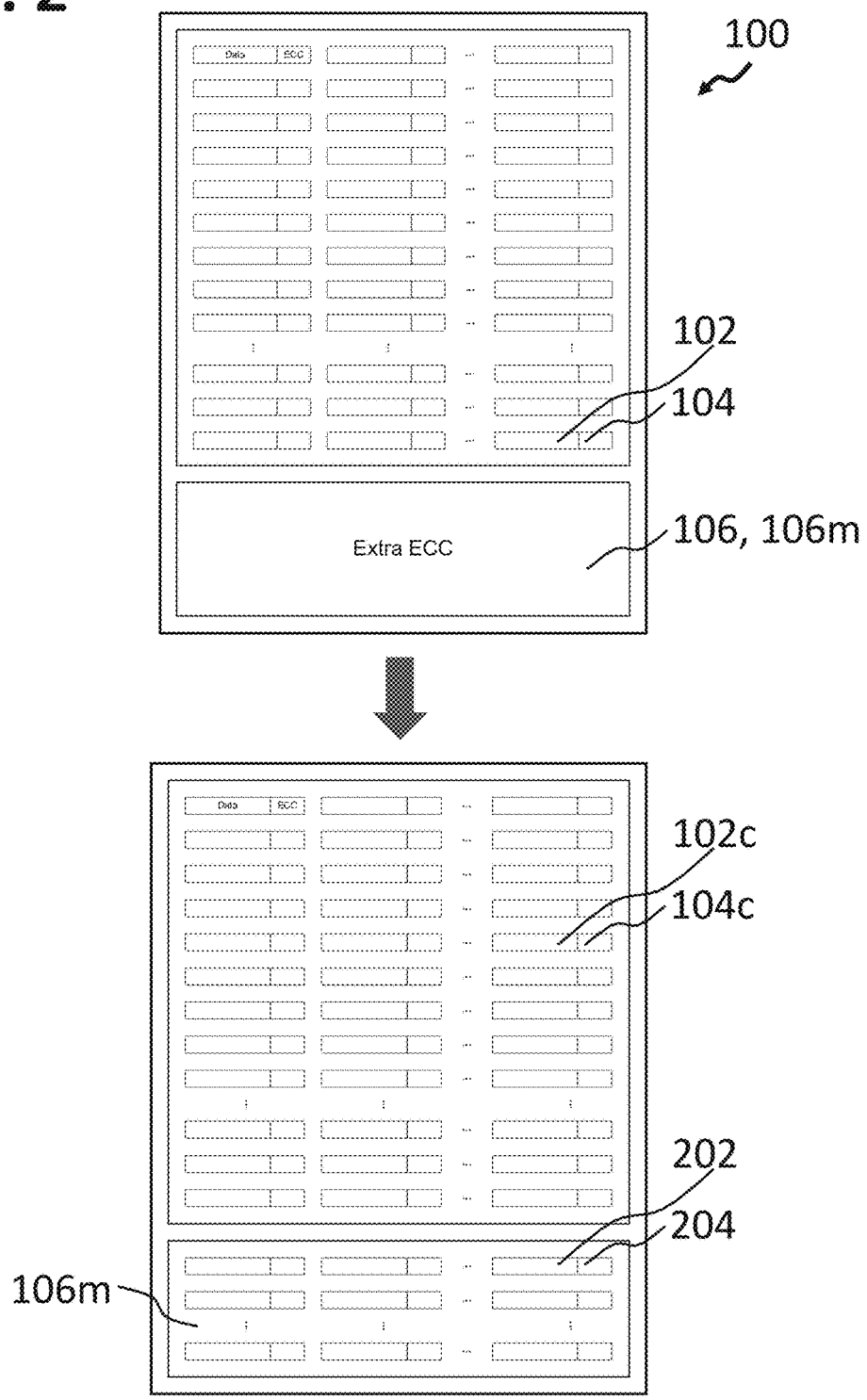
FIG. 2 shows schematic views of the memory device of FIG. 1 during two stages of its use in accordance with various embodiments.

FIG. 1 shows a schematic view of a memory device 100 in accordance with various embodiments, and FIG. 2 shows schematic views of the memory device 100 during two stages of its use in accordance with various embodiments.

In various embodiments, data 102 may be stored in the memory device 100. The memory device 100 may be a non-volatile memory device. The memory device 100 may be one of a group of memory devices, the group including or consisting of: an RRAM, a CBRAM, a PCRAM, an MRAM, a flash memory device, and an EEPROM.

The memory device 100 may be included in, e.g. be part of, a hard disk, an SSD (solid state disk), or a standalone non-volatile memory device like a memory stick.

The data may be stored as one or more data units $102\_1, \ldots, 102\_n$ ($n \geq 1$). Each data unit may for example include one or more bits, one or more bytes, or generally a small data portion, which may also be referred to as data word.

In various embodiments, data 102 may be extended with an ECC (error correcting capability), for example check units 104 formed from the data 102, to protect the data against data loss during the normal ("every day") operation of the memory device or chip. The ECC may also be referred to as normal ECC. For example, for every data unit $102\_1, \ldots, 102\_n$ ($n \geq 1$), a corresponding check unit $104\_1, \ldots, 104\_n$ ($n \geq 1$) may be formed. In various embodiments, each data unit $102\_1, \ldots, 102\_n$ may form a code word of a first code. In other words, the data 102 may be stored in the memory device 100 as data units $102\_1, \ldots, 102\_n$ and check units $104\_1, \ldots, 104\_n$ of a first code. In other words, the ECC may in various embodiments be fine granular, i.e. the data units $102\_1, \ldots, 102\_n$ (the small data portions/words) may be independently protected by adding one or more, e.g. some, ECC bit(s) to each data unit/word. This may allow a fast access, e.g. for readout and/or correction by the first code, of any individual data unit of the at least one data unit $102\_1, \ldots, 102\_n$. In various embodiments, the fine granularity may even be imposed by a necessity of individually reading each data unit $102\_1, \ldots, 102\_n$ (word) independently.

In various embodiments, only a small number of faulty bits (for example one, two, or three) per each data unit $102\_1, \ldots, 102\_n$ (word) may be corrected by applying the first code.

Requirements for the extra ECC in accordance with various embodiments may be different from those for the normal ECC.

In various embodiments, a fine granularity may not be required, because the extra ECC may be only used during an error correction process where a read granularity may be of no concern. Thus, a size of a data portion that may be protected by an individual extra ECC may be large. As high a correction capability as possible with only a small overhead in extra ECC may be required.

In various embodiments, the extra ECC may include or consist of check units 106, e.g. check bits, of a second code. The data units 102 and the check units 106 of the second code may in various embodiments form code words of the second code. In various embodiments, the code words of the second code may be formed by the data units 102, address units corresponding to the data units 102, and the check units of the first code.

In various embodiments, the check units 106 may be stored in a contiguous memory range 106m (as shown in FIG. 1), which may also be referred to as a centralized-type storage. In various embodiments, a storage of the check units of the second code in a non-contiguous memory, also referred to as a decentralized-type storage or fragmented storage, may be possible.

In various embodiments, at some point in time before a data-hazardous process is to be performed on the memory device, in other words, before the memory device 100 is subjected to the data hazardous process or situation, for example before a soldering, or more generally, an attachment of the memory device, is performed, the to be protected data 102 and the extra ECC data 106 used for this protection may be written into the memory device 100, i.e. into memory cells of the memory device 100, e.g. a memory array: This may be done in one combined process, or in two steps, wherein the preloaded data 102 may be extended in the second step with the extra ECC data 106. "Extended" in this context may herein be understood to mean "provided with".

In various embodiments, as the normal ECC, e.g. as the first code, a code may be selected that may be configured/suitable for being used and/or be used throughout a life time of the memory device 100, e.g. a life time of a chip in which the memory device 100 may be included.

In various embodiments, as the extra ECC, e.g. as the second code, a code may be selected that may be configured/suitable for being used for a one-time error correction in the memory device 100. The second code may be configured to correct a large number of errors, as may be caused by the data hazardous process or situation to which the memory device 100 may be exposed. For example, the second code may be capable of correcting more than three errors in a single data unit 102.

In various embodiments, the second ECC may be independent of the first ECC. In various embodiments, the second ECC may, to a certain degree, be entangled with the first ECC. See the embodiments described in context with FIGS. 3A to 3E and FIGS. 4A, 4B for examples of independent and entangled first and second codes, respectively.

In various embodiments, a data correction may be performed after the subjecting the memory device 100 to the data hazardous process, for example after the soldering the memory device 100.

Figure 6A:
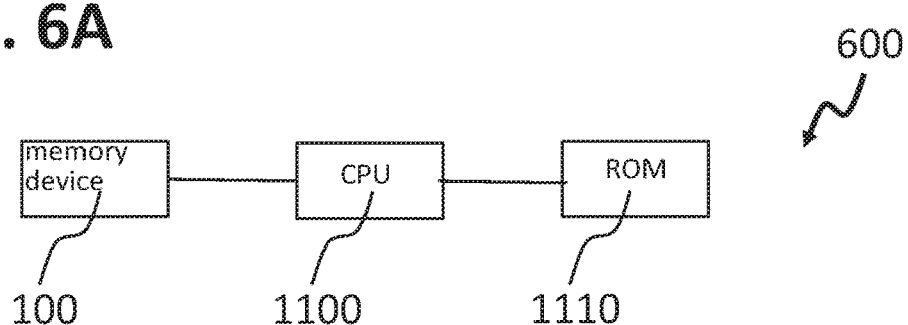
FIG. 6A and FIG. 6B each show a memory device assembly in accordance with various embodiments.

In various embodiments, the data correction may include executing a repair software. The repair software may, in various embodiments, be stored in a read-only-memory (ROM) 1110 that may be connected to a central processing unit (CPU) 1100, which may be connected to the memory device 100 (see FIG. 6A showing a memory device assembly 600 in accordance with various embodiments).

Figure 6B:
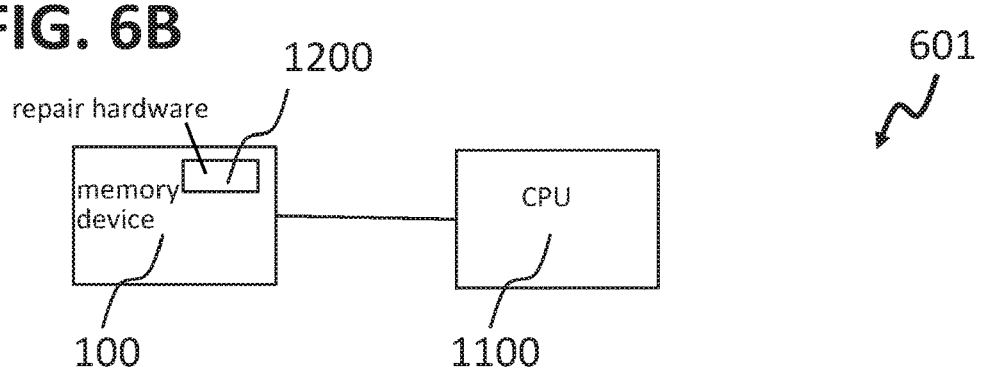

In various embodiments, the data correction may include using a repair hardware 1200 (see FIG. 6B showing a memory device assembly 601 in accordance with various embodiments). The repair hardware may, in various embodiments, be part of or be used together with the memory device 100. The memory device 100 may be connected to a central processing unit (CPU) 1100, which may initiate the using the repair hardware 1200. The repair hardware 1200 may for example include or consist of dedicated digital hardware, or may for example include or consist of a field programmable gate array (FPGA).

In various embodiments, after the subjecting the memory device 100 to the data hazardous process, e.g. after the soldering has been executed, for example when the memory device 100, which may be included in a chip, is powered-up the first time again, a dedicated software or a dedicated hardware may repair any damage caused by the data hazardous process, e.g. the soldering stress. The software or hardware may for example apply the second code to the data units 102 and/or to the check units 104 of the first code for identifying (also referred to as detecting) and correcting erroneous (also referred to as defective) data units 102d, 104d (see FIG. 3B). Corrected values, as determined by the software or the hardware, may in various embodiments be stored in the memory device 100, thereby forming corrected data units 102c, 104c (see FIG. 3E).

Usually, the subjecting the memory device 100 to a data hazardous process such as heating (to a not physically destructive temperature, e.g. heating by soldering), exposure to radiation and/or mechanical stressing, etc., may not lead to a physical damage of the memory cells in the memory device 100, but rather only to a change of a physical state, e.g. a resistance, a magnetization, a mechanical state, etc. of one or more of the memory cells, thereby creating the defective data units 102d and/or defective check units 104d. The defective data units 102d and/or defective check units 104d may, however, be used normally. Thus, in various embodiments, in the erroneous data units 102d and/or defective check units 104d, the defective values may be overwritten by the corrected values. In other words, the corrected data units 102c and/or corrected check units 104c may be stored in the respective memory cells 102d and/or 104c, where erroneous data was left after soldering. Nevertheless, in various embodiments, the corrected data units 102c may be stored to other (than the memory cells in which their corresponding defective data units 102d may be stored) memory cells of the memory device 100.

In various embodiments, the software or hardware may verify a correctness of the memory 100 content by checking its consistency, making use of the existing ECC (e.g. the first code) and/or the extra ECC (the second code).

In various embodiments, the checking may make use of harder than normal read conditions to generate a margin to a normal read operation.

Figure 5:
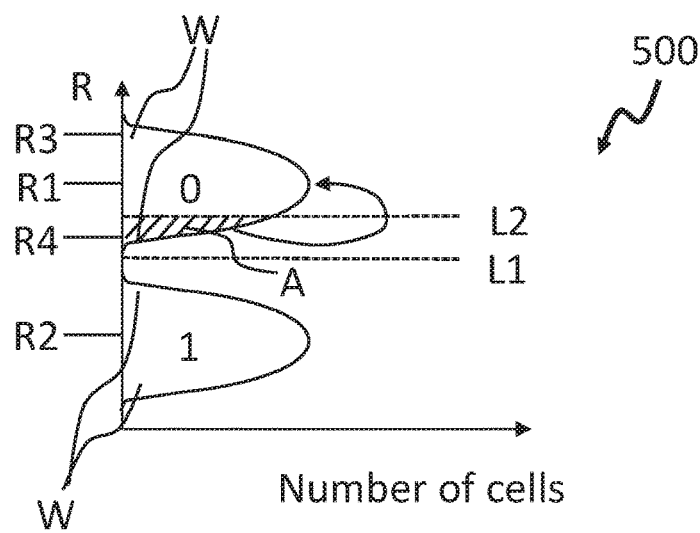
FIG. 5 shows an exemplary number distribution of resistances of memory cells and assigned values.

FIG. 5 shows an exemplary number distribution 500 of physical values (resistances are shown as an example, but this may similarly apply to other physical values used in memory devices, e.g. magnetization, etc.) of memory cells and assigned values for a visualization of such harder than normal read conditions.

During a normal read, a regular reference value L1 may be applied for differentiating between a physical value (here: R) to be assigned a first value (here: 1 if R is smaller than L1) or a second value (here: 0 if R is larger than L1).

The subjecting the memory device 100 to the data hazardous process may in some cases lead to a data unit, e.g. a bit, having an initial value of R1 (assigned 0) to be changed to an erroneous value of R2 (assigned 1). However, in most cases of the data hazardous process affecting the physical value, a changed value may be closer to the initial value R1. Thus, an initial distribution of values may be broadened by the data hazardous process, thereby creating "wings" W of the distributions. Thus, for example, the value of R1 may be changed to R3 or R4. Such wings W may come close to the regular level L1.

In order to create a safety margin for a normal, subsequent, read process, a shifted reference value L2 (e.g. shifted towards the value R1, which may be considered as a reference value for an assignation of the value 0) may be used during the data correction using the extra ECC, e.g. the second code, which may be considered as harder than normal read conditions. With the shifted level L2, all values located in a hatched area A may (erroneously) be assigned a value of 1, and may thus be identified during the data correction using the extra ECC, e.g. the second code, as erroneous data units. They may thus be corrected, which may mean that they are re-written with a physical value (here: R) corresponding to the nominal value R1, which may be sufficiently far away from the reference value L1 for the normal read.

Similarly, a level shifted towards the value R2 may be employed to create a safety margin on the distribution assigned to the value 1.

In various embodiments, in addition to the extra ECC, e.g. the second code, the normal ECC, e.g. the first code, may be applied for detecting and/or correcting erroneous data units 102c, e.g. before and/or during or after the applying the extra ECC (e.g. the second code) for error correction in the data units and/or in the check units of the normal ECC (e.g. the first code).

In various embodiments, in a case the check detecting incorrect memory content, the error correcting capabilities of the existing ECC (e.g. the first code) and the extra ECC (e.g. the second code) may be employed to reconstruct the correct memory content, which may then be used to reprogram the memory, e.g. RRAM, cells that have lost their (correct) data content.

In various embodiments, only the defective memory units 102d may be reprogrammed. Alternatively, in addition to the defective memory units 102d, a portion or all of the correct data units may also be reprogrammed, which may be referred to as a refreshing of the portion of the memory device 100 or of the memory device 100. The portion of the memory device may for example be a used portion of the memory device 100, or a portion containing relevant information.

In various embodiments, after the applying the extra ECC (e.g. the second code) for error correction in the data units and/or in the check units of the normal ECC (e.g. the first code), in other words, after the repair process is performed, the extra ECC (e.g. the check units 106 of the second code) may not be required anymore, and the memory cells 106m, also referred to as memory range, originally used to store the extra ECC (e.g. the check units 106 of the second code) may be freed for use by the normal application.

In various embodiments, the freeing of the "extra ECC"-memory cells 106m may be performed by a software, for example as a part of the software that may also perform the data correction.

In various embodiments, the freeing of the "extra ECC"-memory cells 106m may be performed by a hardware, for example as a part of the hardware that may also perform the data correction, for example a dedicated digital hardware or a field programmable gate array.

In various embodiments, the extra ECC memory range (the memory cells 106m) that may be required to solve the reliability issues, may have a "second life" as normal non-volatile memory, i.e. it may be economically "recycled" for new purposes, once it is not required for extra ECC anymore.

In various embodiments, the re-usability, e.g. for an intended normal use such as data storage, of the extra memory used for storing the extra ECC may allow to use an extra ECC requiring a large storage volume, without thereby decreasing the memory that may be available for normal use.

The large storage volume available for the extra ECC, e.g. for check bits of the second code, may allow to use an extra ECC (e.g., second code) with a large error correcting capability.

In various embodiments, an individual access to the data units 102 after the subjecting the memory device 100 to the data-hazardous process and before the applying the second code for error correction in the data units and/or in the check units of the first code, may not be required. Thus, the second code may not be required to provide a "small granularity", such as the first code. In various embodiments, large portions of data may be protected in common by the second code. Thereby, a high efficiency in terms of required storage volume may be reached, because providing an error detection/correction for a memory area containing small data portion may require relatively more data storage volume than is required for the same error detection in the same memory area containing large data portions.

In various embodiments, the second code may be used only a single time during a lifetime of the memory device 100, for example after the first start of the memory device after the subjecting the memory device 100 to the data-hazardous process, e.g. after a soldering of the memory device 100 (or a chip in which the memory device may be included, respectively).

In various embodiments, another temporary stress may be anticipated during the lifetime of the memory device, for example another heating process that may be required after the memory device 100 has already been used for normal data storage, or a memory device 100 that may be used in a space mission, wherein the memory device 100 may be used normally during a preparation phase on earth, and is then expected to be subjected to data-hazardous radiation during the space mission, where it may be activated when reaching a final destination. In that case, the extra ECC, e.g. the check bits of the second code, may again be stored in the memory device 100, e.g. in the memory cells 106m that previously had been freed and have been used for regular data storage, or in a different region of the memory device. Data stored in the memory cells in which the anew storing of the extra ECC, e.g. the check bits of the second code, is foreseen may be relocated (if they are still required) before the storing of the extra ECC, e.g. the check bits of the second code.

In various embodiments, the applying the extra ECC (e.g. the second code) for error correction in the data units and/or in the check units of the normal ECC (e.g. the first code) may be configured to start automatically. The automatic start may for example be performed upon or after a first starting/use of the memory device 100 after having been subjected to the data hazardous process, when the data hazardous process has stopped, e.g. when the memory device 100 is cooled down after a soldering, when it is released from mechanical stress, and/or when it is removed or shielded from a source of radiation. For example, the software or hardware may be configured to automatically start the repair program upon or directly after the starting of the memory device 100.

In various embodiments, the applying the extra ECC (e.g. the second code) for error correction in the data units and/or in the check units of the normal ECC (e.g. the first code) may be configured to be started manually. A manual starting is to be understood as a start that may not occur automatically, but may require a trigger event, e.g. a command sent to the memory device 100.

In the following, exemplary embodiments are described in context with FIG. 3A to FIG. 3F and FIG. 4A and FIG. 4B. The memory device 100 may be a memory device as described above.

For a description of the exemplary embodiments, a coding theory terminology may be used, which may be known to a person skilled in the art. For a better understanding, some basic terms are described in the following.

A linear code C, as may be used in various embodiments, for example as the first code and/or as the second code, may be described by a G-matrix G and by a H-matrix H. For a code of a length n with k information bits $x=x_1, \ldots, x_k$ and $m=n-k$ check bits $c=c_1, \ldots, c_m$ and $n=k+m$, the G-matrix G is a (k,n) matrix, and the H-matrix H is an (m,n) matrix.

In systematic form, the matrix G may be $$G=(I_k, P_{k,m}),$$

wherein $I_k$ is a k-dimensional identity matrix, and $P_{k,m}$ is a (k,m) matrix, which may be referred to as parity matrix.

The check bits c, which may be determined from the data bits by $$c = x \cdot P_{k,m},$$

and $(x,c)=(x_1, \ldots, x_k, c_1, \ldots, c_m)=v_1, \ldots, v_n=v$ form a code word of the code C. The terms code word and code vector may be used as synonyms.

The H-matrix H may have the form $$H=(P_{m,k}^T, I_m).$$

Here, $P_{m,k}^T$ may be the transposed matrix of the matrix $P_{k,m}$, and $I_m$ may be an m-dimensional identity matrix.

A code word $v=v_1, \ldots, v_n$ may suffer a single-bit or multi-bit error to form a non-code word $v'=v_1', \ldots, v_n'$. A difference between a code word v and a non-code word v' having suffered a single-bit or multi-bit error may be described as an error vector e, wherein $$e=e_1, \ldots, e_n = v_1+v_1', \ldots, v_n+v_n' = v+v'$$

wherein "+" is an addition modulo 2, also referred to as exclusive or (XOR). An error syndrome s with $s=s_1, \ldots, s_m$ of a word $v'=v+e$ may be $$s^T = H \cdot v'^T = H \cdot (v^T + e^T) = H \cdot (e^T),$$

because for a code word v, $$s^T = H \cdot v^T = 0.$$

For $i=1, \ldots, n$, an i-th component $e_i$ of an error vector $e=e_1, \ldots, e_n$ may be 1, if an error-free component $v_i$ is disturbed to $\bar{v}_i$, and $e_i$ may be zero, if the component $v_i$ is error-free. Here, $s^T$, $v^T$ and $v'^T$ may be transposed column vectors of the row vectors s, v and v', respectively.

An error syndrome of an error may be equal to an XOR-sum of the columns of the H-matrix, for which the respective components of the error vector may be 1.

In the following, if it is not known if a word is a code word or an erroneous/disturbed word having suffered a single-bit or multi-bit error, the word may be referred to as v'.

For a t-bit-error correcting code with $t \geq 1$, all error syndromes for 1-bit-error, ..., t-bit-error may be pairwise distinct, which may allow a definite correction taking into account the error syndrome.

Figure 3A:
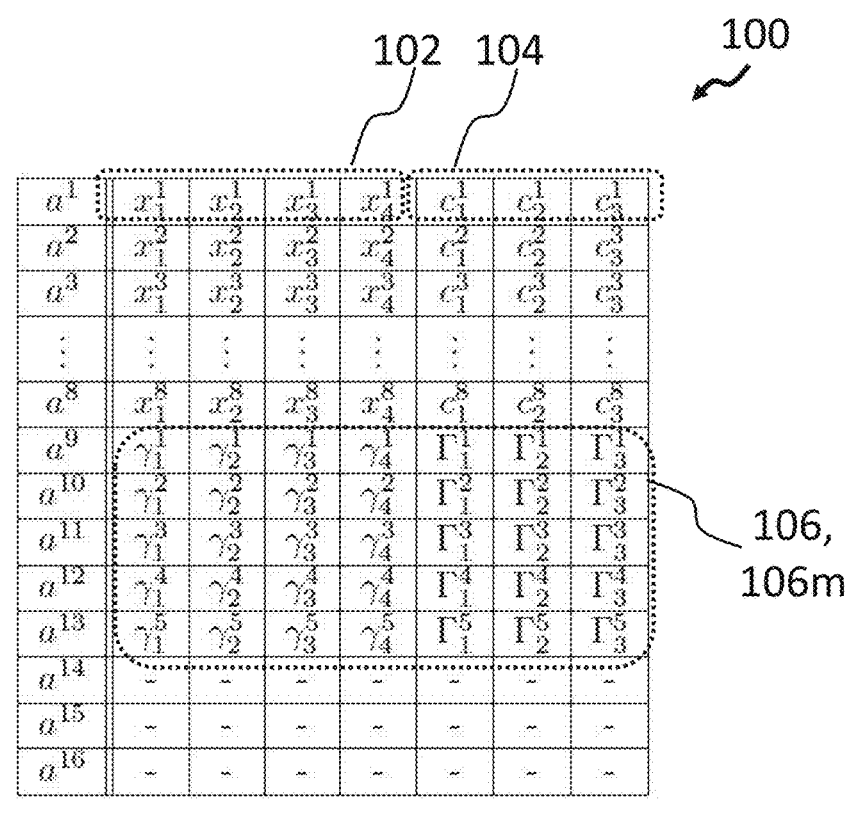

In various embodiments, as shown in FIG. 3A, in a memory device having 16 addresses $a^1, \ldots, a^{16}$ with a word of width $n=7$, data may be stored. For $i=1, \ldots, 8$, a word $v^i=v_1^{i'}, \ldots, v_7^{i'}$ may be stored at an address $a^i$. In an error-free case, $$v^i = v^i = v_1^i, \ldots, v_7^i = x_1^i, x_2^i, x_3^i, x_4^i, c_1^i, c_2^i, c_3^i = x^i, c^i$$

is a code word of a first code $C_1$ with four data bits $x_1^i$, $x_2^i$, $x_3^i$, $x_4^i = x^i$ and three check bits $c_1^i$, $c_2^i$, $c_3^i$, $c=c^i$. The first code $C_1$ may, in this exemplary embodiment, be a Hamming code with a G-matrix $$G_1 = \begin{pmatrix} 1 & 0 & 0 & 0 & 1 & 1 & 0 \\ 0 & 1 & 0 & 0 & 1 & 0 & 1 \\ 0 & 0 & 1 & 0 & 0 & 1 & 1 \\ 0 & 0 & 0 & 1 & 1 & 1 & 1 \end{pmatrix} = (I_4, P_{4,3})$$

with $$P_{4,3} = \begin{pmatrix} 1 & 1 & 0 \\ 1 & 0 & 1 \\ 0 & 1 & 1 \\ 1 & 1 & 1 \end{pmatrix}.$$

$P_{4,3}$ may be referred to as parity matrix, and $I_4$ is the 4-dimensional identity matrix. The H-matrix $H_1$ is $$H_1 = \begin{pmatrix} 1 & 1 & 0 & 1 & 1 & 0 & 0 \\ 1 & 0 & 1 & 1 & 0 & 1 & 0 \\ 0 & 1 & 1 & 1 & 0 & 0 & 1 \end{pmatrix} = (P_{2,4}^T, I_3)$$

wherein $$P_{3,4}^T = \begin{pmatrix} 1 & 1 & 0 & 1 \\ 1 & 0 & 1 & 1 \\ 0 & 1 & 1 & 1 \end{pmatrix}$$

is the transposed matrix of matrix $P_{4,3}$, and $I_3$ is the 3-dimensional identity matrix.

The code $C_1$ may be referred to as a row code. The check bits $c^i$ of the row code may be determined from the data bits $x^i$ from $$c^i = x^i \cdot P_{4,3},$$

such that $$c_1^i = x_1^i + x_2^i + x_4^i$$

$$c_2^i = x_1^i + x_3^i + x_4^i$$

$$c_3^i = x_2^i + x_3^i + x_4^i$$

wherein "+" is the addition modulo 2 (XOR).

For example, for the data bits $x^1=(1, 0, 1, 1)$, the check bits $c^1$ may result:

$$c^1 = x^1 \cdot P_{4,3} = (1, 0, 1, 1) \cdot \begin{pmatrix} 1 & 1 & 0 \\ 1 & 0 & 1 \\ 0 & 1 & 1 \\ 1 & 1 & 1 \end{pmatrix} = (0, 1, 0).$$

In FIG. 3A, it is assumed that no errors occurred, and that error-free code words of the code $C_1$ are stored at the addresses $a^1, \ldots, a^8$.

At the address $a^9$, bitsy, $\gamma_1^1, \gamma_2^1, \gamma_3^1, \gamma_4^1, \Gamma_1^1, \Gamma_2^1, \Gamma_3^1$ may be stored, at the address $a^{10}$, bits $\gamma_1^2, \gamma_2^2, \gamma_3^2, \gamma_4^2, \Gamma_1^2, \Gamma_2^2, \Gamma_3^2$ may be stored, ..., and at the address $a^{13}$, bits $\gamma_1^5, \gamma_2^5, \gamma_3^5, \gamma_4^5, \Gamma_1^5, \Gamma_2^5, \Gamma_3^5$ may be stored.

In FIG. 3A, for $j=1, \ldots, 4$, the bits $\gamma_j^1, \gamma_j^2, \gamma_j^3, \gamma_j^4, \gamma_j^5$ stored at the addresses $a^9, \ldots, a^{13}$ in j-th bit position may be the check bits of data bits $x_j^1, x_j^2, x_j^3, x_j^4, x_j^5, x_j^6, x_j^7, x_j^8$, stored at addresses $a^1, \ldots, a^8$ in j-th position, of a second code $C_2$, which may be referred to as a column code.

In an embodiment, for $i=1, \ldots, 5$, the bits $\Gamma^i = \Gamma_1^i, \Gamma_2^i, \Gamma_3^i$, which may be arranged as rows, may be check bits of the first code $C_1$ of the check bits $\gamma^i = \gamma_1^i, \gamma_2^i, \gamma_3^i, \gamma_4^i$, which may also be arranged as rows and may have been formed from the data bits stored at the addresses $a^1, \ldots, a^8$ by applying the second code $C_2$.

In a further embodiment, the bits $\Gamma_i^1, \Gamma_i^2, \Gamma_i^3, \Gamma_i^4, \Gamma_i^5$, which may be stored in columns at addresses $a^9, \ldots, a^{13}$ in FIG. 3A, may be check bits of the second code $C_2$ of the check bits $c_i^1, c_i^2, c_i^3, c_i^4, c_i^5, c_i^6, c_i^7, c_i^8$ of the first code $C_1$.

The column code $C_2$ may, in accordance with the various embodiments, have the generator matrix $$G_2 = \begin{pmatrix} 1 & 0 & 0 & 0 & 0 & 0 & 0 & 1 & 1 & 1 & 0 & 0 \\ 0 & 1 & 0 & 0 & 0 & 0 & 0 & 1 & 1 & 0 & 1 & 0 \\ 0 & 0 & 1 & 0 & 0 & 0 & 0 & 1 & 1 & 0 & 0 & 1 \\ 0 & 0 & 0 & 1 & 0 & 0 & 0 & 1 & 0 & 1 & 1 & 0 \\ 0 & 0 & 0 & 0 & 1 & 0 & 0 & 1 & 0 & 1 & 0 & 1 \\ 0 & 0 & 0 & 0 & 0 & 1 & 0 & 0 & 1 & 0 & 1 & 1 \\ 0 & 0 & 0 & 0 & 0 & 0 & 1 & 0 & 0 & 1 & 1 & 0 \\ 0 & 0 & 0 & 0 & 0 & 0 & 0 & 1 & 0 & 1 & 0 & 1 & 1 \end{pmatrix}$$

and the H-matrix $$H_2 = \begin{pmatrix} 1 & 1 & 1 & 1 & 1 & 1 & 0 & 0 & 1 & 0 & 0 & 0 & 0 \\ 1 & 1 & 1 & 0 & 0 & 0 & 1 & 1 & 0 & 1 & 0 & 0 & 0 \\ 1 & 0 & 0 & 1 & 1 & 0 & 1 & 0 & 0 & 0 & 1 & 0 & 0 \\ 0 & 1 & 0 & 1 & 0 & 1 & 1 & 1 & 0 & 0 & 0 & 1 & 0 \\ 0 & 0 & 1 & 0 & 1 & 1 & 0 & 1 & 0 & 0 & 0 & 0 & 1 \end{pmatrix}$$

At addresses $a^{15}$, $a^{16}$, $a^{17}$ in FIG. 3A, no particular values are stored, and the respective memory cells are marked with a symbol "-". The code $C_2$ may be a Hsiao code, which may be known to a person skilled in the art, and which may allow correcting of all 1-bit-errors in components of the data bits that form a column, and to detect all 2-bit errors in such a column. All columns of the H-matrix $H_2$ are pairwise distinct from each other and include an odd number of 1s (numbers one).

In FIGS. 3A to 3F, the data bits $x_j^1, x_j^2, x_j^3, x_j^4, x_j^5, x_j^6, x_j^7, x_j^8$ may be considered to correspond to the data units 102 described above, the check bits $c^i$ of the row code may be considered to correspond to the check units 104, and the bits $\gamma_1^i, \gamma_2^i, \gamma_3^i, \gamma_4^i, \Gamma_1^i, \Gamma_2^i, \Gamma_3^i$ may correspond to the extra ECC, i.e. to the check bits of the second code.

Figure 3B:
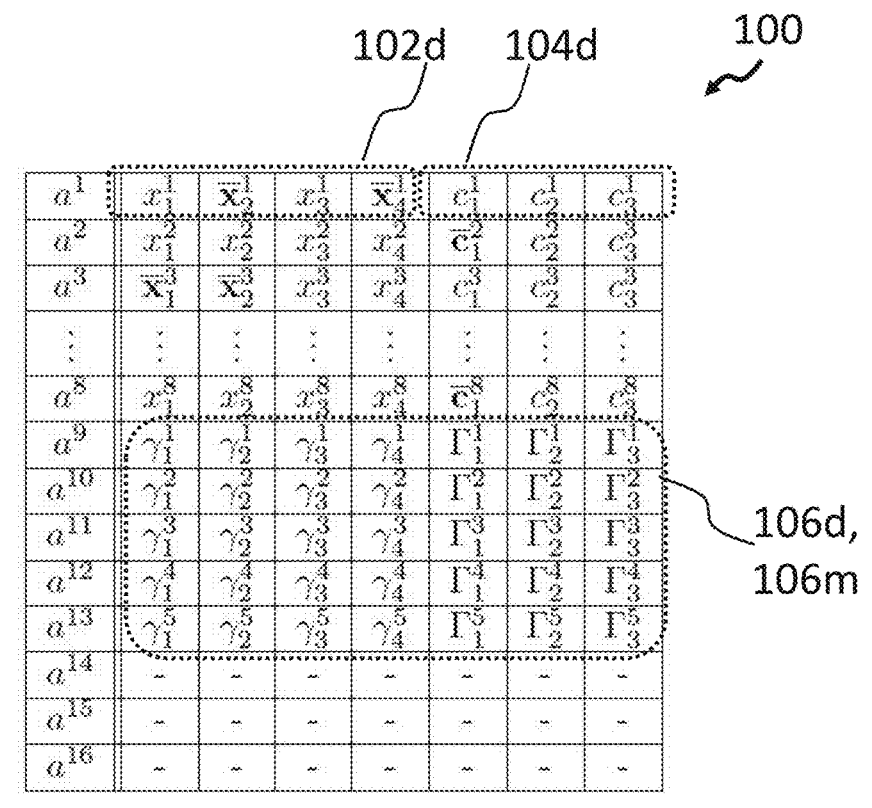

In FIG. 3B, a situation is shown in which 6 bit errors have occurred during or after a heating of the memory device (or, respectively, a chip into which the memory device may be integrated). After a cooling down of the memory device (the chip), the errors may be corrected using the codes $C_1$ and $C_2$.

In an exemplary embodiment, the data bits $x^1$ stored at address $a^1$ may be disturbed from $x_2^1$ to $\bar{x}_2^1$ in the second bit, and from $x_4^1$ to $\bar{x}_4^1$ in the fourth bit. At the address $a^2$, the fifth bit may be disturbed from $c_1^2$ to $\bar{c}_1^2$. Furthermore, data bits $x^3$ stored at address $a^3$ may be disturbed from $x_1^3$ to $\bar{x}_1^3$ in the first bit, and from $x_2^3$ to $\bar{x}_2^3$ in the second bit. At the address $a^8$, the fifth bit may be disturbed from $c_1^8$ to $\bar{c}_1^8$.

An error correction may, in accordance with various embodiments, first make use of the code $C_1$.

Bits $x^1$ stored at the address $a^1$ may be erroneous in the second and fourth bit position. The error syndrome of these errors may be equal to a sum of the second and fourth column $[101]^T + [111]^T = [010]^T$ of the H-matrix $H_1$. Here, $[010]^T$ may be equal to the sixth column of the H-matrix $H_1$, and the 2-bit-error may temporarily be wrongly corrected as a 1-bit-error of the sixth bit position, such that temporarily, additionally $c_2^1$ may be disturbed to $\bar{c}_2^1$.

Bits $x^3$ stored at the address $a^3$ may be erroneous in the first and second bit position. The error syndrome of these errors may be equal to a sum of the first and second column $[110]^T + [101]^T = [011]^T$ of the H-matrix $H_1$. Here, $[011]^T$ may be equal to the third column of the H-matrix $H_1$, and the 2-bit-error may temporarily be wrongly corrected as a 1-bit-error of the third bit position, such that temporarily, additionally $x_3^3$ may be disturbed to $\bar{x}_3^3$.

Bits stored at the address $a^2$ may be erroneous in only the fifth bit position. The error syndrome of this error may be equal to the fifth column $[100]^T$ of the H-matrix $H_1$, and the 1-bit-error may correctly be corrected from $\bar{c}_1^8$ to $c_1^8$.

Figure 3C:
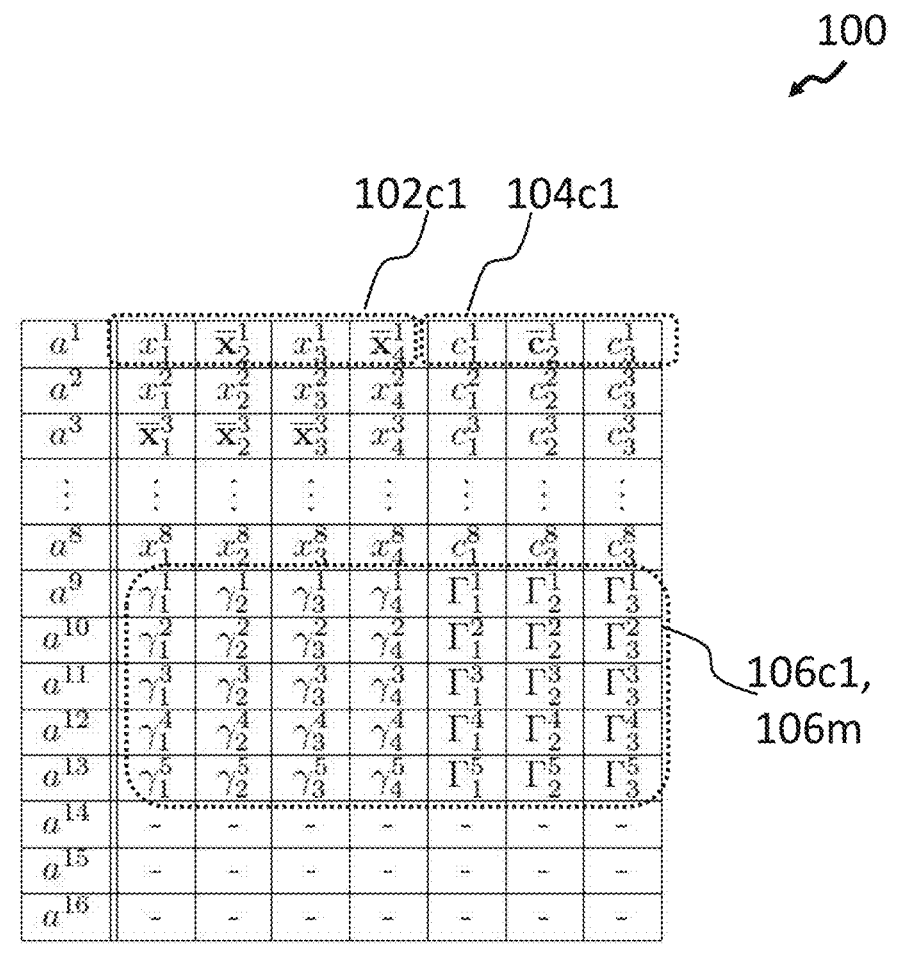
Figure 3D:
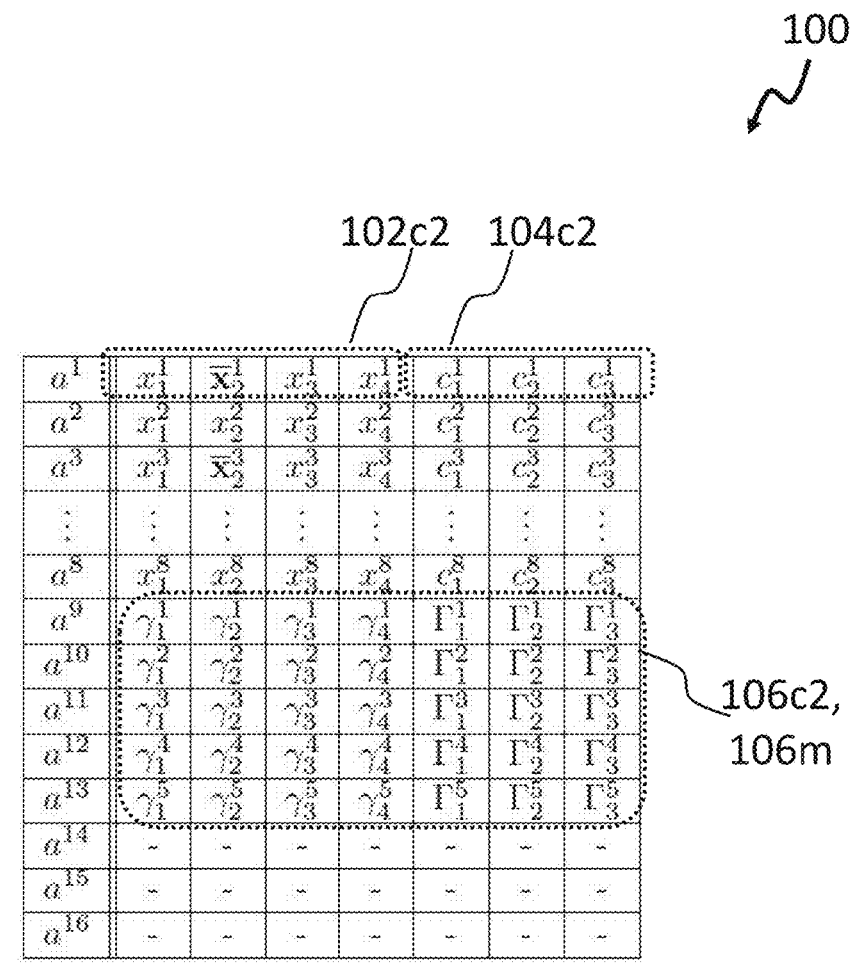
Figure 3E:
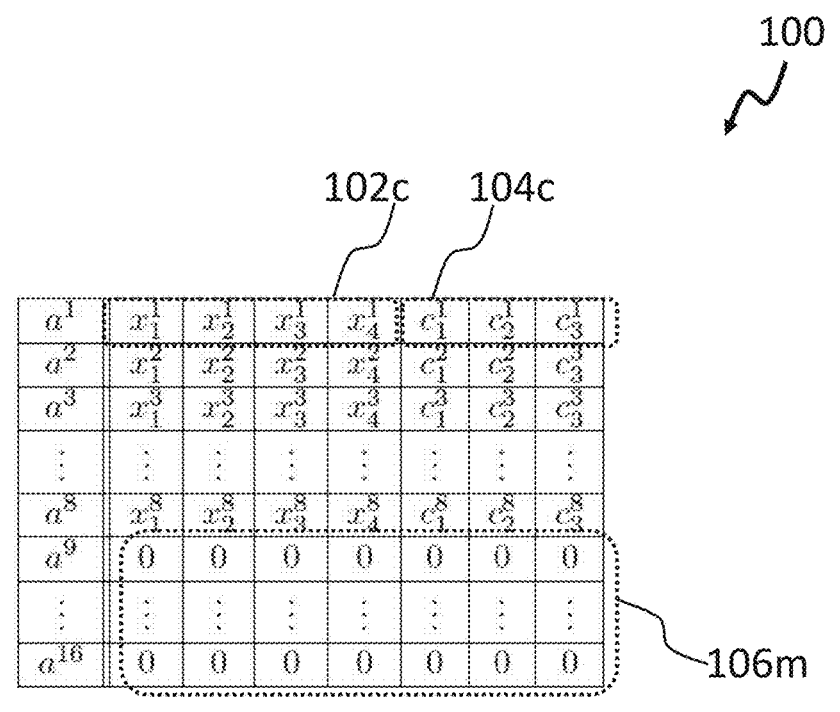
Figure 3F:
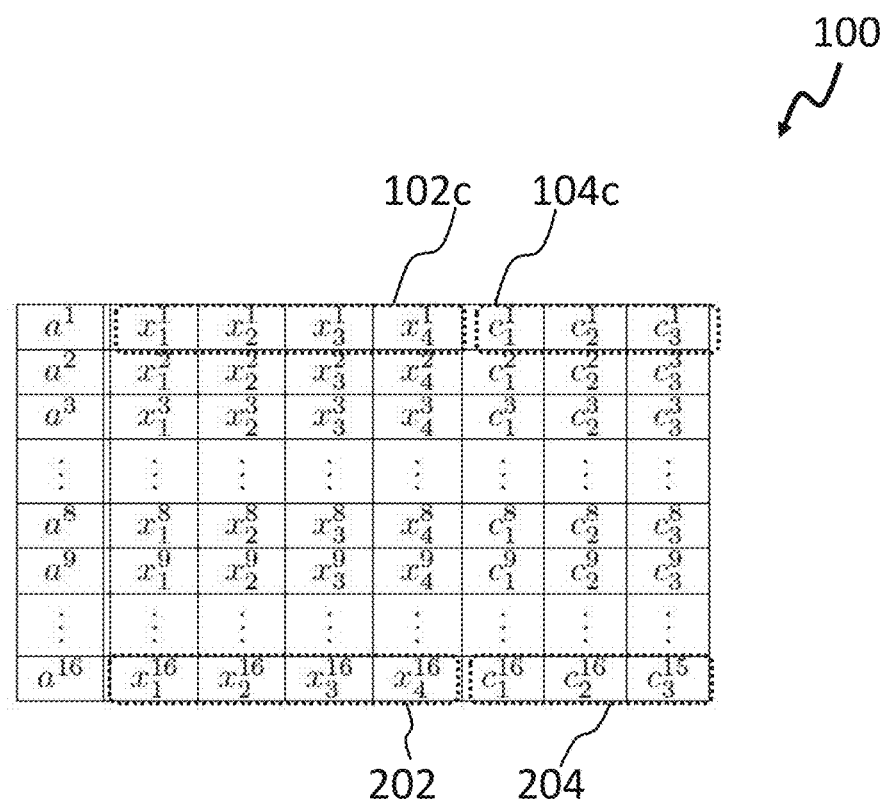

In FIG. 3C, the memory device 100 is shown with the (temporarily) corrected bits after the correction using the Hamming code $C_1$. Due to a temporary nature of the correction, the temporarily corrected data units and check units are marked as 102c1, 104c1, respectively, and only the final corrected data- and check units (as shown in, e.g., FIG. 3E and FIG. 3F) may be referred to with an index "c" (without a number after the "c").

In each of the first, third, fourth and sixth column of FIG. 3C, one erroneous bit may be present, namely the erroneous bits $\bar{x}_1^3, \bar{x}_3^3, \bar{x}_4^1, \bar{c}_2^1$. These erroneous bits may be corrected using the second code (the column code C2) to the correct bits $x_1^3, x_3^3, x_4^1, c_2^1$.

In FIG. 3D, the memory device 100 is shown with the (temporarily) corrected bits after the correction using the column code $C_2$. Remaining erroneous bits are $\bar{x}_2^1, \bar{x}_2^3$ stored at addresses $a^1$ and $a^3$, respectively.

In a further error correction sub-process, the row code $C_1$ may again be used for error correction. At the address $a^1$, only a single erroneous bit, $\bar{x}_2^1$, may remain, which may now be corrected to the correct value $x_2^1$. At the address $a^3$, only a single erroneous bit, $\bar{x}_2^3$, may remain, which may now be corrected to the correct value $x_2^3$. Thus, all six errors that had been present after the subjecting the memory device 100 to the data hazardous process (the soldering) may have been corrected, as shown in FIG. 3E.

In an embodiment, the bits stored at the addresses $a^1, \ldots, a^{13}$ may be read n=7 times, and one bit position per read may be corrected.

In an embodiment, a correction of two bits may be conducted in parallel.

After the correcting the erroneous bits, the check bits of the second code $C_2$ (forming the extra ECC) may be deleted. This is represented in FIG. 3E by the memory cells having the addresses $a^9, \ldots, a^{16}$ having a value of 0. The corrected data bits 102c and the corrected check bits 104c may be retained, or at least a portion (also referred to as the retaining portion) of the corrected data bits 102c and/or of the corrected check bits 104c, respectively, may be retained.

In various embodiments, the memory cells having the addresses $a^9, \ldots, a^{16}$ may now be used for storing data bits and check bits of the code $C_1$, which is shown in FIG. 3F, where not only the memory cells having the addresses $a^1, \ldots, a^{15}$, but also the memory cells having the addresses $a^9, \ldots, a^{16}$ are used for storing data bits and corresponding check bits of the row code $C_1$.

In various embodiments, during normal operations, i.e. after the correction of the errors introduced by the data hazardous process, e.g. the soldering, only the row code $C_1$ may be used for error detection and correction. This may make it possible to store additional data bits in the memory device 100.

Figure 4A:
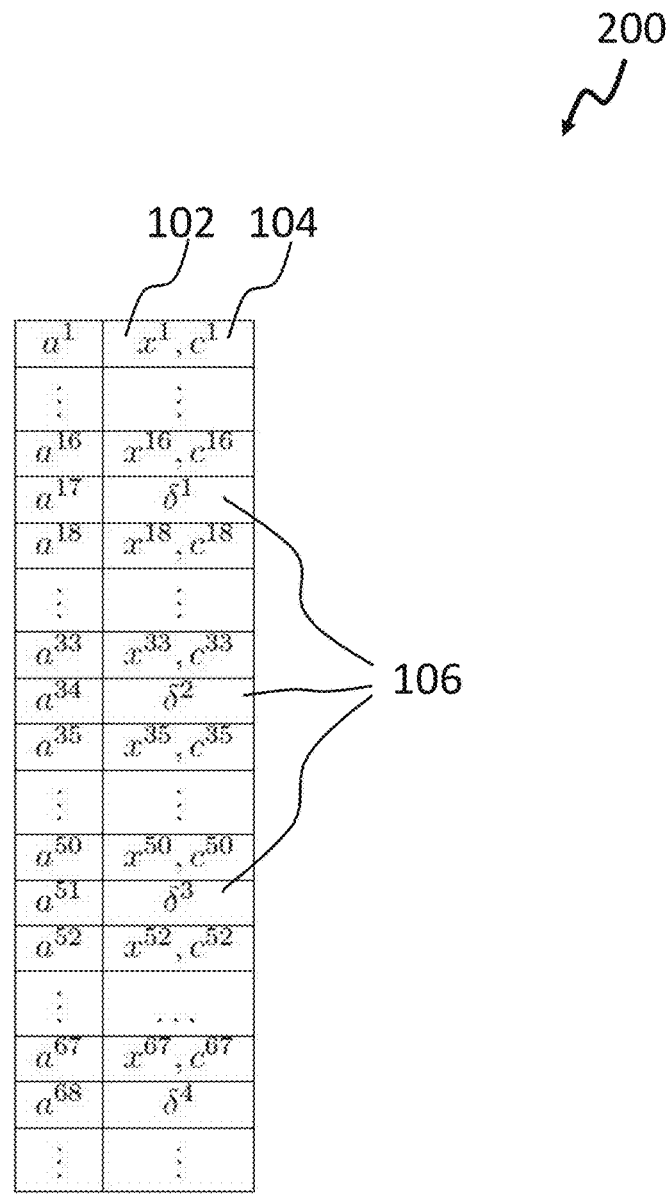
FIG. 4A and FIG. 4B show schematic views of a memory device in accordance with various embodiments during different stages of its use.
Figure 4B:
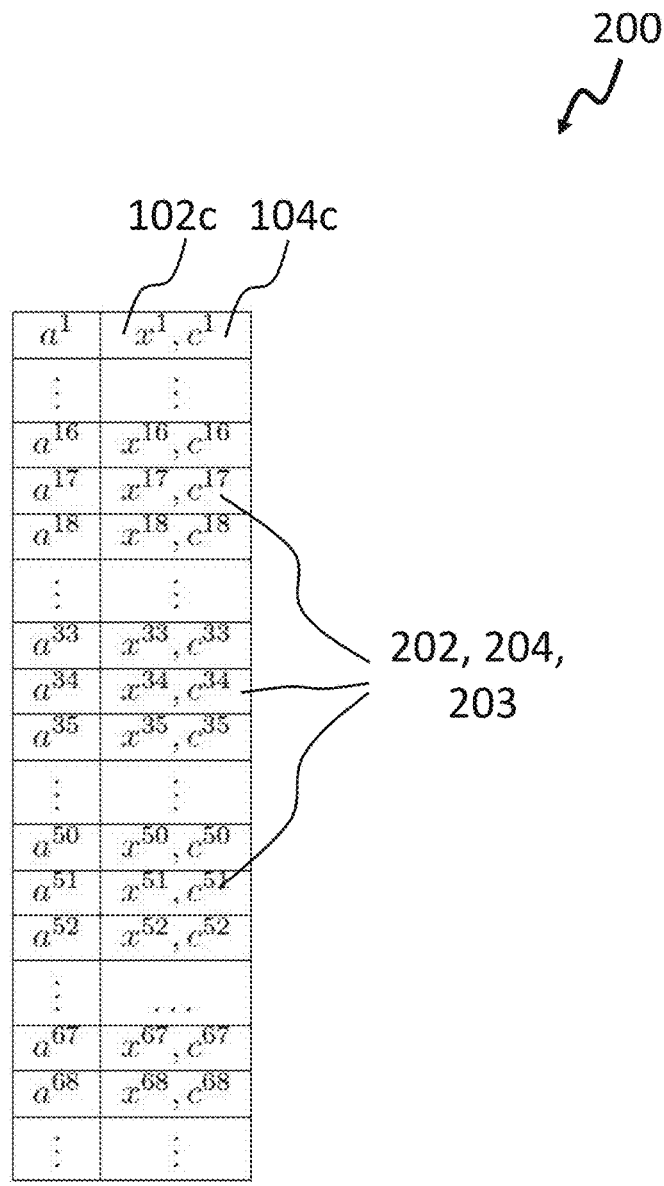

Various further embodiments are described in context with FIG. 4A and FIG. 4B. The memory device 200 of FIG. 4A and FIG. 4B may be in accordance to the memory device described above in context with FIG. 1 and FIG. 2, and may be similar to the memory device 100 as described in context with FIGS. 3A to 3F.

The memory device 200 of FIG. 4A, 4B may be an addressable memory device with a word width of 72.

64 data bits $x^i = x_1^i, \ldots, x_{64}^i$ may be stored at each address $a^i$, for $i=1, \ldots, 16$, which may be protected by 8 check bits $c^i = c_1^i, \ldots, c_8^i$ of a Hsiao code, which may be known to a person skilled in the art. The Hsiao code, which may allow correcting of all 1-bit-errors and detecting of all 2-bit errors, may be the first code $C_1$.

Data bits $x^1 = x_1^1, \ldots, x_{64}^1, \ldots x^{16} =, \ldots, x_1^{16}, \ldots, x_{64}^{16}$ stored in the first 16 consecutive addresses $a^1, \ldots, a^{16}$ may form a first block $X^1$ of $16 \times 64 = 1024$ data bits. These 1024 data bits may form the data bits $$X^1 = x^1, \ldots, x^{16} = x_1^1, \ldots, x_{64}^1, \ldots, x_1^{16}, \ldots, x_{64}^{16} = X_1^1, \ldots, X_{1024}^1,$$

of a first code word of a second code $C_2$, which may be a 6-bit-error correcting BCH code over a Galois field $GF(2^{11})$, which may be known to a person skilled in the art. A required number of check bits may be $6 \times 11 = 66$, wherein the check bits may be referred to as $\delta^1 = \delta_1^1, \ldots, \delta_{66}^1$. These 66 check bits may be stored at address $a^{17}$. Since a word width of the memory device is 72, the check bits may be stored at the first 66 bit positions of the address $a^{17}$.

64 data bits $x^i = x_1^i, \ldots, x_{64}^i$ may be stored at each address $a^i$, for $i=18, \ldots, 33$, which may be protected by 8 check bits $c^i = c_1^i, \ldots, c_8^i$ of the Hsiao code (the first code) $C_1$.

Data bits $x^{18} = x_1^{18}, \ldots, x_{64}^{18}, \ldots, x^{33} = x_1^{33}, \ldots, x_{64}^{33}$ stored in the 16 consecutive addresses $a^{18}, \ldots, a^{33}$ may form a second block $X^2$ of $16 \times 64 = 1024$ data bits. These 1024 data bits may form the data bits $$X^2 = x^{18}, \ldots, x^{33} = x_1^{18}, \ldots, x_{64}^{18}, \ldots, x_1^{33}, \ldots, x_{64}^{33} = X_1^2, \ldots, X_{1024}^2,$$

of a second code word of the second code $C_2$. The corresponding $6 \times 11 = 66$ check bits of the code $C_2$ may be referred to as $\delta^2 = \delta_1^2, \ldots, \delta_{66}^2$. These 66 check bits may be stored at address $a^{34}$.

Further blocks $X^3$, $X^4$ of 1024 data bits each and the respective corresponding 66 check bits $\delta^3$, $\delta^4$, ..., of the second code $C_2$ may be stored at addresses $a^{35}, \ldots, a^{50}, a^{51}$; $a^{52}, \ldots, a^{67}, a^{68}$; ..., as shown in FIG. 4A.

After the data hazardous process, e.g. the soldering process, is finished, for example during or after an initial start of operations of the memory device 100, during a first sub-process, the respective blocks of 1024 data bits may be corrected using the 6-bit-error correcting BCH code $C_2$. After the correcting the data bits using the code $C_2$, the respective 66 check bits (per block) $\delta^1, \delta^2, \delta^3, \ldots$ of the code $C_2$ may be deleted, or, in a case where this is possible, simply overwritten (in a flash memory device, for example, it may be required to delete the bits before re-writing to them).

In various embodiments, the corrected check bits $c^1$, $c^2$, ... of the Hsiao-code $C_1$, which may have a width of 8 bit each, may for example be formed from the corrected data bits $X^1$, $X^2$, having 64 data bits each, such that a direct correction of the check bits of the code $C_1$ by the code $C_2$ may not be required. This may be referred to as independent codes $C_1$, $C_2$.

In various embodiments, the check bits of the first code may be included in when forming the blocks of bits that may be corrected by the second code $C_2$, which may be referred to as entangled codes.

A person skilled in the art may for example perform the correction using the BCH-code $C_2$ by applying a Berlekamp-Massey-algorith, as for example described in Rao, T., Fujiwara, E. "Error Control Coding for Computer Systems", Prentice Hall, 1989, on pages 105-109.

The addresses $a^{17}$, $a^{34}$, $a^{51}$, ..., which may have been used for storing the check bits $\delta^1, \delta^2, \delta^3, \ldots$ of the code $C_2$, may, after the correcting the data bits using the code $C_2$, be used for storing further data bits and check bits of the code $C_1$, for example as shown in FIG. 4B.

While the addresses $a^{17}$, $a^{34}$, $a^{51}$, ..., in FIG. 4A may be addressing the check bits $\delta^1, \delta^2, \delta^3, \ldots$ of the code $C_2$, the addresses $a^{17}$, $a^{34}$, $a^{51}$, ..., may, in FIG. 4B, be addressing data bits $x^{17}$, $x^{34}$, $x^{51}$ (64 bits each) and corresponding 8 check bits of the code $C_1$ each ($c^{17}$, $c^{34}$, $c^{51}$).

In the various embodiments shown in FIG. 4A, FIG. 4B, the check bits of the second code $C_2$ may have been stored at an address immediately following the addresses at which data bits of a block and corresponding check bits of the first code $C_1$ may be stored.

In various embodiments, the check bits of the second code $C_2$ of the different blocks of data bits (and corresponding check bits) may be stored in a consecutive address area. This may for example be useful in a flash memory device, in which memory cells may be deleted in a consecutive address area.

In various embodiments, a 2-bit-error correcting BCH code may be used as the code $C_1$, and a byte-correcting code, for example a Reed-Solomon-code, may be used as the second code $C_2$. In accordance with such embodiments, check bits of the BCH code $C_1$ may be formed and may be stored at the same address of the memory device as the corresponding data bits. The bits stored at an address may form a byte of the byte-correcting code $C_2$. For an address area, which may for example be formed by N (N≥2) consecutive addresses, the bytes may form a word, for which check bytes of the byte-correcting codes may be formed.

In various embodiments, for a correction of an error that may have been generated while the memory device 100 was subjected to the data hazardous process, e.g. to the soldering, the first code $C_1$ may only be used for error detection. An error detected using the code $C_1$ may then indicate an erroneous byte, such that a position of erroneous bytes may be known when correcting the erroneous bytes using the code $C_2$. In such a case of a position of an error already being known, only the error value, i.e. its deviation from the correct value, may need to be determined. Such a correction may be referred to as correction of an erasure.

In various embodiments, after the correction is performed, the check bytes of the byte correcting code $C_2$ may be deleted or may be overwritten by new data. The first code $C_1$ may, after deleting the check bytes of the code $C_2$, be used as a 2-bit-correcting code.

In various embodiments, in a case of using the first code $C_1$ only for an error detection of errors of a byte, i.e. for a determination of a position of defective bytes, a high error coverage, in other words a high capability of error detection, may be reached.

In various embodiments, during a coding of the data bits $x^i$ and check bits $c^i$ for storing at an address $a^i$, the address bits $a^i$ may be included in the forming of the check bits $c^i$, such that, in an error-free case, $$\langle x^i, a^i, c^i \rangle = (x^i, a^i) \cdot G_1$$

may be a code word of the code $C_1$. Here, $G_1$ may be the G-matrix of the code $C_1$ in systematic form, and $a^i$ may be the write address. At the address $a^i$, only $x^i$, $c^i$ may be stored.

In various embodiments, during a reading of the potentially erroneous bits $x^{i'}$, $c^{i'}$ stored at the address $a^{i'}$, the error syndrome $$H_1 \cdot (x^{i'}, a^{i'}, c^{i'})^T = s^T$$

may be determined, wherein $a^{i'}$ may be the potentially erroneous read address, and $s^T$ may be the error syndrome, which may, in its transposed form, be referred to as column vector. Using the error syndrome, it may be determined if a correctable error $x^{i'}$, $c^{i'}$ has occurred, or whether an error has occurred in the address bits.

In various embodiments, when coding the data bits $x^i$ and check bits $c^i$ for storing at an address $a^i$, bits derived from the address bits $a^i$ may be included in the forming of the check bits $c^i$, such that, in an error-free case, $$<x^i, f(a^i), c^i> = (x^i, f(a^i)) \cdot G_1$$

may be a code word of the code $C_1$. Here, $G_1$ may be the G-matrix of the code $C_1$ in systematic form, and $a^i$ may be the write address. At the address $a^i$, only $x^i$, $c^i$ may be stored. f may be a function that uniquely relates the address bits and the respective derived bits.

In various embodiments, $$f(a^i) = f(a_1^i, \ldots, a_m^i) = a_1^i + a_2^i + \ldots + a_m^i$$

wherein $f(a^i)$ may determine a parity of the address bits.

In various embodiments, during a reading of the potentially erroneous bits $x^{i'}$, $c^{i'}$ stored at the address $a^{i'}$, the error syndrome $$H_1 \cdot (x^{i'}, f(a^i), c^{i'})^T = s^T$$

may be determined, wherein $a^{i'}$ may be the potentially erroneous read address, and $s^T$ may be the error syndrome, which may, in its transposed form, be referred to as column vector. Using the error syndrome, it may be determined if a correctable error $x^{i'}$, $c^{i'}$ has occurred, or whether an error has occurred in the address bits.

In various embodiments, a regular or irregular low-density-parity code may be used as the second code C2, as for example described in Lin, S. and Costello, D., "Error Control Coding", second edition, Pearson/Prentice Hall 2004, S. 852.

In various embodiments, a decoding and error correction for the low-density-parity code may for example be performed using majority-logic-decoding, a bit-flipping algorithm, a weighted majority decoding, or a weighted bit-flipping decoding, for example as described in Lin, S. and Costello, D., "Error Control Coding", second edition, Pearson/Prentice Hall 2004, S. 871-874, or by any other suitable decoding process. A skilled person may for example use a hard decision coding or a soft decision decoding.

In various embodiments, a Reed-Muller code may be used, for example as described in Lin, S. and Costello, D., "Error Control Coding", second edition, Pearson/Prentice Hall 2004, S. 105-114, or any other suitable error correcting code.

FIG. 7 shows a process flow 700 of a method of using a memory device in accordance with various embodiments.

The method may include storing data units, check units of a first code and check units of a second code in memory cells of the memory device, wherein the data units and the check units of the first code form code words of the first code, and wherein the data units and the check units of the second code form code words of the second code (in 710), applying the second code for error correction in the data units and/or in the check units of the first code (in 720), after the correcting the errors, retaining the data units and the check units of the first code and deleting the check units of the second code, thereby freeing the memory cells that are occupied by the check units of the second code (in 730), and during a subsequent using of the memory device, storing data units and check units of the first code in the memory cells including the freed-up memory cells (in 740).

In various embodiments, a method of using a memory device is provided. The method may include storing data units, check units of a first code and check units of a second code in memory cells of the memory device, wherein the data units and the check units of the first code form code words of the first code, and wherein the data units and the check units of the second code form code words of the second code, applying the second code for error correction in at least a portion of the data units and/or in at least a portion of the check units of the first code, after the correcting the errors, retaining at least a retaining portion of the data units and of the check units of the first code and deleting at least a deleting portion of the check units of the second code, thereby freeing the memory cells that are occupied by the deleting portion of the check units of the second code, and during a subsequent using of the memory device, storing data in at least a reuse portion of the freed-up memory cells.

In various embodiments, the method may further include, after the storing the data units of the first code and the check units of the second code and before the applying the second code for error correction, subjecting the memory device to a data hazardous process.

In various embodiments, the method may further include, after the storing the data units of the first code and the check units of the second code and before the subjecting the memory device to a data hazardous process, de-activating the memory device.

In various embodiments, the data hazardous process may be at least one of a group of processes including heating, mechanical stressing, and exposure to radiation.

In various embodiments, the method may further include, before applying the second code for the error correction, applying the first code for detecting and/or correcting the errors and/or further errors.

In various embodiments, the storing the check units of the second code may include storing the check units of the second code in a consecutive area of the memory device.

In various embodiments, the storing the check units of the second code may include storing the check units of the second code in a plurality of non-consecutive memory cells.

In various embodiments, the applying the second code for error correction in at least a portion of the data units and/or in at least a portion of the check units of the first code and the deleting at least a deleting portion of the check units of the second code may be executed automatically during a first activation of the memory device after the subjecting the memory device to a data hazardous process.

In various embodiments, the applying the second code for error correction in at least a portion of the data units and/or in at least a portion of the check units of the first code and the deleting at least a deleting portion of the check units of the second code may be initiated manually.

In various embodiments, the method may further include, after the subsequent using of the memory device, storing again check units of the second code in a subset of memory cells of the memory device.

In various embodiments, the second code may be a block code, for instance a parity code, a Hamming code, a shortened Hamming code, a Hsiao code, a shortened Hsiao code, a t-bit-error correcting BCH code, a shortened t-bit-error correcting BCH code, for example with t≥2, a Reed-Muller-Code, a shortened Reed-Muller-Code, a cyclic code, a shortened cyclic code, a Reed-Solomon-Code, a shortened Reed-Solomon-Code, a modified Reed-Solomon-Code, a RAID-code, a byte-correcting code or a Low-Density Parity Code, a non-linear code, a convolutional code, a turbo code or another suitable code.

In various embodiments, the check bits of the first code may be treated as additional data bits by the second code.

In various embodiments, the check bits of the first code may be treated as check bits by the second code.

In various embodiments, the method may further include, during or after the applying the second code for the error correction in at least a portion of the data units and/or in at least a portion of the check units of the first code, refreshing at least a further portion of the data units and/or at least a further portion of the first check units.

In various embodiments, the method may further include, applying the first code after the second code was applied or applying the second code after the first code was applied.

In various embodiments, a memory device is provided. The memory device may be configured to execute the method in accordance with various embodiments.

In various embodiments, the memory device may be a non-volatile memory device.

In various embodiments, the memory device may be one of a group of memory devices, the group including or consisting of: an RRAM, a CBRAM, a PCRAM, an MRAM, a flash memory device, and an EEPROM.

In various embodiments, a data storage device is provided. The data storage device may include the memory device in accordance with various embodiments, and the memory data storage device may be one of a group of data storage devices, the group including a hard disk, an SSD, and a standalone non-volatile memory device like a memory stick.

In various embodiments, a memory device assembly is provided. The memory device assembly may include the memory device in accordance with various embodiments, and a CPU coupled to the memory device.

In various embodiments, in the memory device assembly, the memory device may further include a programmable portion, wherein the programmable portion may be configured to execute the method in accordance with various embodiments.

In various embodiments, the memory device assembly may further include a ROM coupled to the CPU, wherein the ROM may be configured to execute the method of in accordance with various embodiments.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of using a memory device, the method comprising:
storing data units, check units of a first code and check units of a second code in memory cells of the memory device, wherein the data units and the check units of the first code form code words of the first code, and wherein the data units and the check units of the second code form code words of the second code;
applying the second code for error correction in at least a portion of the data units and/or in at least a portion of the check units of the first code;
after the correcting of the errors, retaining at least a retaining portion of the data units and of the check units of the first code and deleting at least a deleting portion of the check units of the second code, thereby freeing the memory cells that were occupied by the deleting portion of the check units of the second code;
during a subsequent using of the memory device, storing data in at least a reuse portion of the freed-up memory cells; and
after the storing of the data units of the first code and the check units of the second code and before the applying the second code for error correction, subjecting the memory device to a data hazardous process.

2. The method of claim 1, further comprising:
after the storing the data units of the first code and the check units of the second code and before the subjecting the memory device to a data hazardous process, de-activating the memory device.

3. The method of claim 1,
wherein the data hazardous process is at least one of a group of processes including heating, mechanical stressing, and exposure to radiation.

4. The method of claim 3,
wherein the data hazardous process is the heating process, and wherein the heating process is a soldering process.

5. The method of claim 1, further comprising:
before applying the second code for the error correction, applying the first code for detecting and/or correcting the errors and/or further errors.

6. The method of claim 1,
wherein the storing the check units of the second code comprises storing the check units of the second code in a consecutive area of the memory device.

7. The method of claim 1,
wherein the storing the check units of the second code comprises storing the check units of the second code in a plurality of non-consecutive memory cells.

8. The method of claim 1,
wherein the applying the second code for error correction in at least a portion of the data units and/or in at least a portion of the check units of the first code and the deleting of at least a deleting portion of the check units of the second code is executed automatically during a first activation of the memory device after the subjecting the memory device to a data hazardous process.

9. The method of claim 1,
wherein the applying the second code for error correction in at least a portion of the data units and/or in at least a portion of the check units of the first code and the deleting of at least a deleting portion of the check units of the second code is initiated manually.

10. The method of claim 1, further comprising:
after the subsequent using of the memory device, storing again check units of the second code in a subset of memory cells of the memory device.

11. The method of claim 1,
wherein the second code is a block code, for instance a parity code, a Hamming code, a shortened Hamming code, a Hsiao code, a shortened Hsiao code, a t-bit-error correcting BCH code, a shortened t-bit-error correcting BCH code, for example with t≥2, a Reed-Muller-Code, a shortened Reed-Muller-Code, a cyclic code, a shortened cyclic code, a Reed-Solomon-Code, a shortened Reed-Solomon-Code, a modified Reed- Solomon-Code, a RAID-code, a byte-correcting code or a Low-Density Parity Code, a non-linear code, a convolutional code or a turbo code.

12. The method of claim 1, wherein the check units of the first code are treated as additional data units by the second code.

13. The method of claim 1, wherein the check units of the first code are treated as check units by the second code.

14. The method of claim 1, further comprising:
during or after the applying the second code for the error correction in the at least a portion of the data units and/or in the at least a portion of the check units of the first code, refreshing a further portion of the data units and/or a further portion of the first check units.

15. A memory device,
wherein the memory device is configured to execute a method, comprising:
   storing data units, check units of a first code and check units of a second code in memory cells of the memory device, wherein the data units and the check units of the first code form code words of the first code, and wherein the data units and the check units of the second code form code words of the second code;
   applying the second code for error correction in at least a portion of the data units and/or in at least a portion of the check units of the first code;
   after the correcting of the errors, retaining at least a retaining portion of the data units and of the check units of the first code and deleting at least a deleting portion of the check units of the second code, thereby freeing the memory cells that were occupied by the deleting portion of the check units of the second code;
   during a subsequent using of the memory device, storing data in at least a reuse portion of the freed-up memory cells; and
   wherein the storing of the data units of the first code and the check units of the second code occurs before the memory device is subjected to a data hazardous process and wherein the applying of the second code for error correction occurs after the memory device is subjected to the data hazardous process.

16. The memory device of claim 15,
wherein the memory device is a non-volatile memory device.

17. The memory device of claim 15,
wherein the memory device is one of a group of memory devices, the group consisting of:
   an RRAM;
   a CBRAM;
   a PCRAM;
   an MRAM;
   a flash memory device; and
   an EEPROM.

18. A data storage device, comprising:
a memory device configured to execute a method, the method comprising:
   storing data units, check units of a first code and check units of a second code in memory cells of the memory device, wherein the data units and the check units of the first code form code words of the first code, and wherein the data units and the check units of the second code form code words of the second code;
   applying the second code for error correction in at least a portion of the data units and/or in at least a portion of the check units of the first code;
   after the correcting of the errors, retaining at least a retaining portion of the data units and of the check units of the first code and deleting at least a deleting portion of the check units of the second code, thereby freeing the memory cells that were occupied by the deleting portion of the check units of the second code;
   during a subsequent using of the memory device, storing data in at least a reuse portion of the freed-up memory cells; and
   wherein the storing of the data units of the first code and the check units of the second code occurs before the memory device is subjected to a data hazardous process and wherein the applying of the second code for error correction occurs after the memory device is subjected to the data hazardous process;
wherein the data storage device is one of a group of data storage devices, the group consisting of:
   a hard disk;
   an SSD; and
   a standalone non-volatile memory device like a memory stick.

19. a memory device assembly, comprising:
a memory device configured to execute a method, comprising:
   storing data units, check units of a first code and check units of a second code in memory cells of the memory device, wherein the data units and the check units of the first code form code words of the first code, and wherein the data units and the check units of the second code form code words of the second code;
   applying the second code for error correction in at least a portion of the data units and/or in at least a portion of the check units of the first code;
   after the correcting of the errors, retaining at least a retaining portion of the data units and of the check units of the first code and deleting at least a deleting portion of the check units of the second code, thereby freeing the memory cells that were occupied by the deleting portion of the check units of the second code; and
   during a subsequent using of the memory device, storing data in at least a reuse portion of the freed-up memory cells;
   wherein the storing of the data units of the first code and the check units of the second code occurs before the memory device is subjected to a data hazardous process and wherein the applying of the second code for error correction occurs after the memory device is subjected to the data hazardous process; and
a CPU coupled to the memory device.

20. The memory device assembly of claim 19,
wherein the memory device further comprises a programmable portion, wherein the programmable portion is configured to execute a method, the method comprising:
   storing data units, check units of a first code and check units of a second code in memory cells of the memory device, wherein the data units and the check units of the first code form code words of the first code, and wherein the data units and the check units of the second code form code words of the second code;

applying the second code for error correction in at least a portion of the data units and/or in at least a portion of the check units of the first code;

after the correcting the errors, retaining at least a retaining portion of the data units and of the check units of the first code and deleting at least a deleting portion of the check units of the second code, thereby freeing the memory cells that were occupied by the deleting portion of the check units of the second code; and during a subsequent using of the memory device, storing data in at least a reuse portion of the freed-up memory cells.

21. The memory device assembly of claim 19, further comprising:

a ROM coupled to the CPU, wherein the ROM is configured to execute a method, the method comprising:

storing data units, check units of a first code and check units of a second code in memory cells of the memory device, wherein the data units and the check units of the first code form code words of the first code, and wherein the data units and the check units of the second code form code words of the second code;

applying the second code for error correction in at least a portion of the data units and/or in at least a portion of the check units of the first code;

after the correcting the errors, retaining at least a retaining portion of the data units and of the check units of the first code and deleting at least a deleting portion of the check units of the second code, thereby freeing the memory cells that were occupied by the deleting portion of the check units of the second code; and during a subsequent using of the memory device, storing data in at least a reuse portion of the freed-up memory cells.

* * * * *